United States Patent [19]

Hsu et al.

[11] Patent Number: 5,391,510
[45] Date of Patent: Feb. 21, 1995

[54] FORMATION OF SELF-ALIGNED METAL GATE FETS USING A BENIGNANT REMOVABLE GATE MATERIAL DURING HIGH TEMPERATURE STEPS

[75] Inventors: Louis L. Hsu, Fishkill; Gangadhara S. Mathad, Poughkeepsie; Rajiv V. Joshi, Yorktown Heights, all of N.Y.

[73] Assignee: International Business Machines Corporation, Armonk, N.Y.

[21] Appl. No.: 225,360

[22] Filed: Apr. 7, 1994

Related U.S. Application Data

[63] Continuation-in-part of Ser. No. 843,049, Feb. 28, 1992, abandoned.

[51] Int. Cl.⁶ .......................................... H01L 21/265
[52] U.S. Cl. ........................................ 437/44; 437/29; 437/247; 437/962
[58] Field of Search ........................................ 437/44

[56] References Cited

U.S. PATENT DOCUMENTS

| | | | |
|---|---|---|---|
| 3,840,451 | 10/1974 | Golyanov et al. | 204/192 |
| 3,921,282 | 11/1975 | Cunningham et al. | 437/194 |
| 4,312,680 | 1/1982 | Hsu | 148/1.5 |
| 4,358,340 | 11/1982 | Fu | 156/643 |
| 4,520,553 | 6/1985 | Kraft | 437/29 |
| 4,532,698 | 8/1985 | Fang et al. | 29/571 |
| 4,559,693 | 12/1985 | Kamei | 29/571 |
| 4,641,417 | 2/1987 | McDavid | 437/200 |
| 4,661,374 | 4/1987 | Doering | 437/200 |
| 4,729,966 | 3/1988 | Koshino et al. | 437/39 |
| 4,769,339 | 9/1988 | Ishii | 437/39 |
| 4,822,753 | 4/1989 | Pintchovski et al. | 437/192 |
| 4,845,046 | 7/1989 | Shimbo | 437/41 |
| 4,992,388 | 2/1991 | Pfiester | 437/41 |
| 5,028,552 | 7/1991 | Ushiko | 437/41 |
| 5,202,273 | 4/1993 | Nakamura | 437/40 |
| 5,254,862 | 10/1993 | Kalyankjumar et al. | 257/77 |

FOREIGN PATENT DOCUMENTS

| | | |
|---|---|---|
| 57-42151 | 3/1982 | Japan . |
| 63-307739 | 12/1988 | Japan . |
| 2-60131 | 2/1990 | Japan . |

OTHER PUBLICATIONS

D. J. Vikavage, et al., "Plasma Enhanced Chemical Vapor Deposition of Polycrystalline Diamond and Diamondlike Films" 1988 Amer. Vacuum Society, J. Vac. Sci. Technol. A6(3) pp. 1812–1815 May/Jun. 1988.
S. C. Martin, et al., "p-Channel Germanium MOSFET's with High Channel Mobility" IEEE-Electron Device Letters, vol. 10, No. 7, pp. 325–326, Jul. 1989.
G. S. Sandhu, et al., "Reactive Ion Etching of Diamond" App. Phys. Lett. 55 (5) pp. 437–438 American Institute of Physics, Jul., 1989.
H. Matsuhashi, et al., "Effect of W Film Stress on W--Gate MOS Characteristics" Japanese Journal of Applied Physics, pp. 2309–2313 vol. 28, No. 12, Dec. 1989.

*Primary Examiner*—Olik Chaudhuri
*Assistant Examiner*—H. Jey Tsai
*Attorney, Agent, or Firm*—Harold Huberfeld

[57] ABSTRACT

A sub-micron FET is disclosed made by a method using expendable self-aligned gate structure up to and including the step of annealing the source/drain regions. The source/drain regions are formed by ion implantation using the expendable structure (diamond-like-carbon) as a mask. After the expendable structure has performed its further purpose of protecting the gate dielectric from contamination during the annealing cycle, the structure is easily removed by $O_2$ plasma and replaced by a conventional metal gate material.

3 Claims, 5 Drawing Sheets

FORMATION OF SELF-ALIGNED METAL GATE FETS USING A BENIGNANT REMOVABLE GATE MATERIAL DURING HIGH TEMPERATURE STEPS

This application is a continuation in part, of application Ser. No. 07/843,049, filed Feb. 28, 1992.

BACKGROUND OF THE INVENTION

The invention generally relates to field effect transistors of the self-aligned metal gate type and, more particularly, to a method of fabricating same that avoids certain problems associated with high temperature processing steps.

Metal gates have been used to improve gate conductivity in high density self-aligned FET devices. Such use, however, can encounter significant difficulties, e.g., the penetration of the gate metal into the gate oxide (if the metal gate is present during high temperature fabrication steps) as well as otherwise damaging the gate oxide during the gate formation steps. These and other problems become intensified when the FET devices are reduced to the submicron range. Not only must the gate oxide be protected during the aforementioned processing steps, but that objective must be accomplished in a manner consistent with self-alignment techniques in order to achieve close dimensional control for high device density chip designs where there is a desire to avoid the need for advanced lithographic tools.

There are many examples in the prior art of the use of "sidewall" technology to define photolithography-free submicron-sized structures such as FET gates, for example, Japanese patent 42151 of March 1982, issued to Tokashi Itou and assigned to Fujitsu; Japanese patent 307739 of December 1988, issued to Michihiko Hasegawa and assigned to Fujitsu; Japanese patent 60131, issued February 1990 to Naomasa Oka and assigned to Matsushita Electric Works, Ltd.; U.S. Pat. No. 4,729,966 issued to Koshino et al on Mar. 8, 1988; U.S. Pat. No. 4,769,339 issued to Tetsuo Ishii on Sep. 6, 1988 (in the latter two patents, metal FET gates are left in place during high temperature source/drain annealing cycles); U.S. Pat. No. 4,312,680 issued to Sheng Hsu on Jan. 26, 1982; U.S. Pat. No. 4,358,340 issued to Horng-Sen Fu on Nov. 9, 1982; U.S. Pat. No. 4,559,693 issued to Kiyoho Kamei on Dec. 24, 1985.

More particularly, the above-cited U.S. Pat. Nos. 4,729,966 and 4,769,339 provide for sidewall metal gates which are used as masks during source and drain formation and remain in place during high temperature annealing for later use in the final structure. Some undesirable penetration of the metal into the gate oxide inevitably results.

The problem of gate metal penetration into gate oxide is avoided in U.S. Pat. No. 4,532,698, issued to Frank F. Fang, et al on Aug. 6, 1985. The metal gate is removed prior to annealing (after having served as a mask during source and drain ion implantation) and then is replaced by a second self-aligned metal gate. Yet another self-alignment technique, but still one in which a resist "dummy-gate" member is removed prior to source-drain anneal, is reported in the article *p-Channel Germanium MOSFETS with High Channel Mobility*, by Suzanne C. Martin et al, IEEE Electron Devices Letters, Vol. 10, No. 7, July 1989, p. 325. A metal gate is added after the annealing step is completed. Although the gate metal penetration problem alluded to above is avoided in the last two cited references, the gate oxide is left uncovered in both cases during the high temperature annealing step, exposing said oxide to latent contaminants present within the annealing furnace.

SUMMARY OF THE INVENTION

One object of the present invention is to provide self-aligned metal gate FETs having substantially no gate metal or other contamination of the gate insulator attributable to annealing steps.

Another object is to provide a method for making self-aligned metal gate FETs whereby the gate dielectric is protected during annealing steps by a high temperature-stable, inert and easily removable material.

A further object is to provide a method for making sub-micron self-aligned metal gate FETs whereby the gate dielectric is covered during annealing steps by a relatively thin seeding layer of the final gate metal and an overlying relatively thick layer of a high temperature-stable, inert and easily removable material.

These and other objects of the present invention, as will appear from a reading of the following specification, are achieved by the provision of an FET gate structure which is self-aligned relative to the source and drain regions and is expended after the source and drain have been annealed. A diamond-like-carbon (DLC) material preferably is used as the expendable gate structure to protect the gate dielectric layer from contamination during high temperature annealing. The DLC material is replaced by a metal gate electrode to complete the FET gate structure.

BEST MODE FOR CARRYING OUT THE INVENTION

Figure 1A:
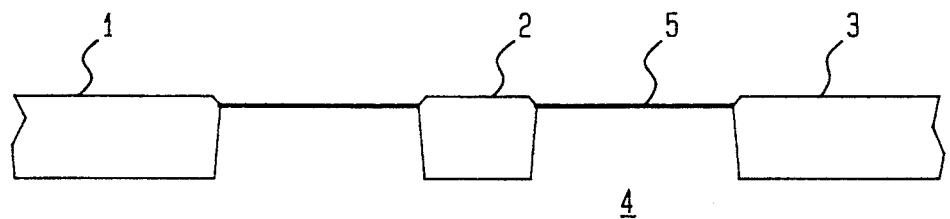
FIGS. 1a–1L are a series of simplified cross-sectional views of a portion of a semiconductor chip as it appears at a succession of times during the fabrication of a first embodiment of the present invention especially adapted for sub-micron FETs.

Referring to FIG. 1a, fully recessed oxide isolation regions 1, 2 and 3 are produced in a conventional manner on silicon substrate 4. For the sake of simplicity, conventional channel stop implants (beneath the oxide regions) and threshold adjust implants (in the device areas between the oxide regions) are not shown. About 250Å of pad oxide 5 is grown.

Figure 1B:
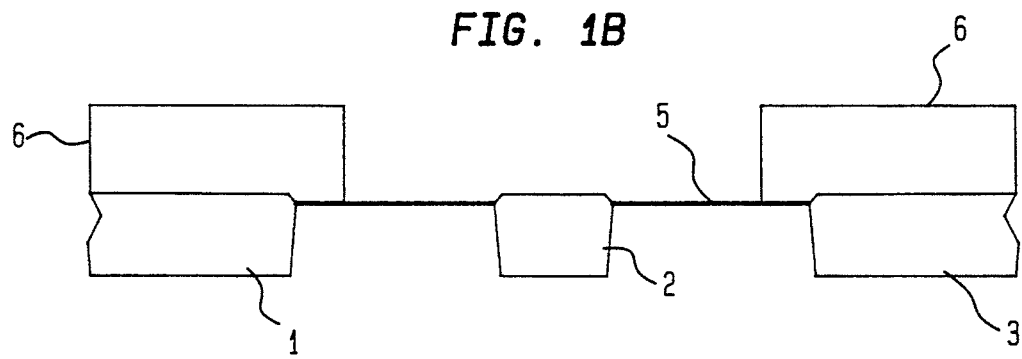
Figure 1C:
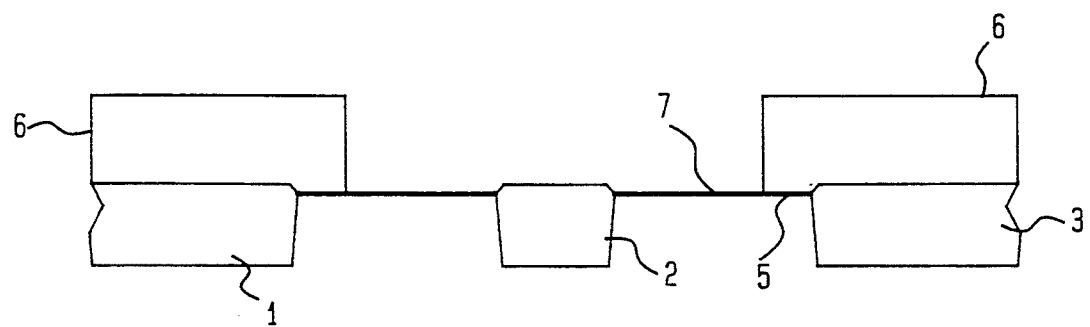

CVD polysilicon or amorphous Si 6 is deposited, photolithographed and patterned preferably by reactive ion etching to yield the structure shown in FIG. 1b. Pad oxide 5 now is stripped and replaced by about 100Å of regrown gate oxide 7 (FIG. 1c).

Figure 1D:
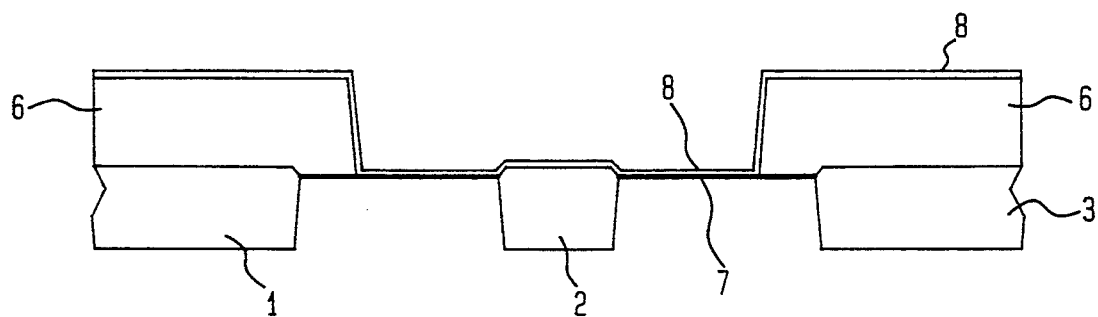
Figure 1E:
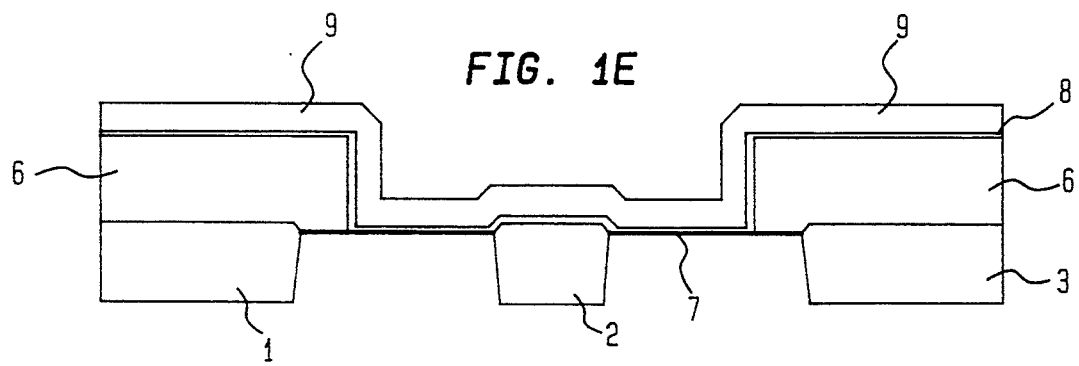

In order to specially adapt the embodiment of the present invention represented by FIGS. 1a–1L for sub-micron FETS, a gate metal seeding layer, such as about 250Å of tungsten silicide 8 is deposited on the entire surface of the structure including gate oxide 7 as depicted in FIG. 1d. Alternatively, TiN may be used as seeding material for later deposited CVD tungsten as described in U.S. Pat. No. 4,822,753 issued to Faivel Pintchovski et al on Apr. 18, 1989. Then, a CVD diamond-like carbon layer (DLC) is deposited (FIG. 1e).

The thickness of layer 9 is equivalent to the designated gate length, e.g., 2000Å or less.

The use of the DLC layer 9 is an important aspect of the present invention. The deposited DLC film has good thermal and chemical stability even at high annealing temperatures and easily can be removed later with an $O_2/Ar$ plasma without damaging the underlying seed layer 8 or gate oxide 7. A suitable etching process is described in the paper *Reactive Ion Etching of Diamond* by G. S. Sandu et al, Journal Appl. Phys. Lett. Vol. 55, No. 5, 1989, p. 437. The thermal and chemical stability of DLC 9, furthermore, fully protects the gate oxide from ambient contamination during high temperature processing steps without introducing film stress as in other cases where metal gates are in place as reported in the paper *Effect of W Film on W Gate MOS Characteristics* by H. Matsuhashi et al, Japan J. Appl. Phys. 2 Lett. (Japan) Vol. 28, No. 12, Dec. 1989.

A method for the deposition of DLC layer 9 is described in U.S. Pat. No. 3,840,451 issued to V. Golyanov et al on Oct. 8, 1974. Another method is set forth in the paper *Plasma Enhanced Chemical Vapor Deposition of Polycrystalline Diamond and Diamondlike Films* by D. J. Vitavage et al, J. Vac. Sci. Technol. A6(3), May/June 1988, p. 1812. DLC layers can be deposited over a wide range of deposition temperatures (200° C. to 1,000° C.) using a variety of hydrocarbon precursors (i.e. $CH_4$, $C_2H_6$) using either a RF or microwave generated plasma. Deposition conditions for downstream microwave generated DLC films are: a frequency of 2.45 GHz, power of 200–2,000 watts, a pressure of 0.1–100 Torr, a gas flow of 10–500 sccm, and a substrate temperature of 200°–1,000° C., substrate bias $> -100$ V dc or an RF bias $> -5$ V. Diamond films deposited are polycrystalline or amorphous in nature with average gain size between 50–300 angstroms. The DLC has a matched thermal expansion coefficient with silicon (e.g. silicon: 32E-7/C, DLC: 18E-7/C). In addition, the DLC film has a low compressive stress and after being annealed at a temperature of at least 400° C. and preferably 500° C., the stress is reduced to a non-measurable level.

Figure 1F:
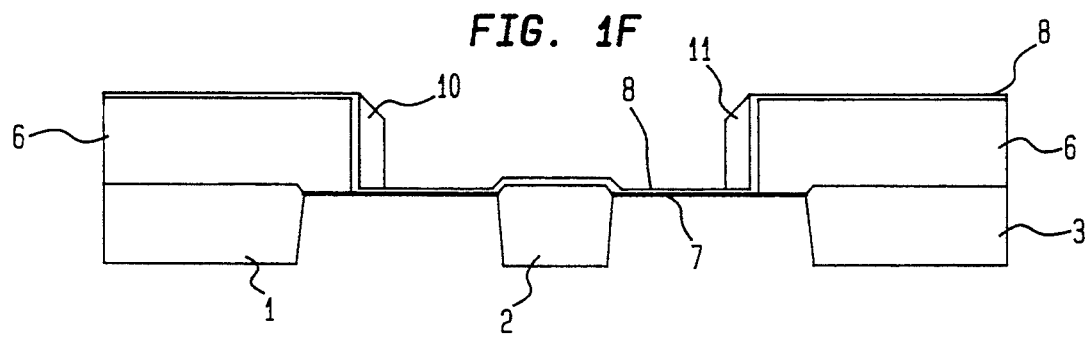
Figure 1G:
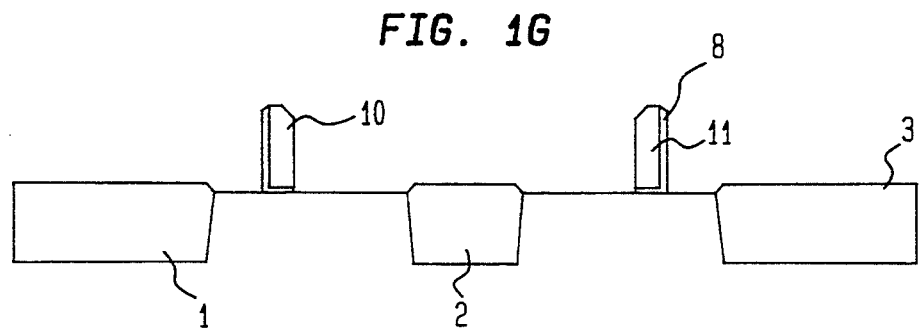
Figure 1H:
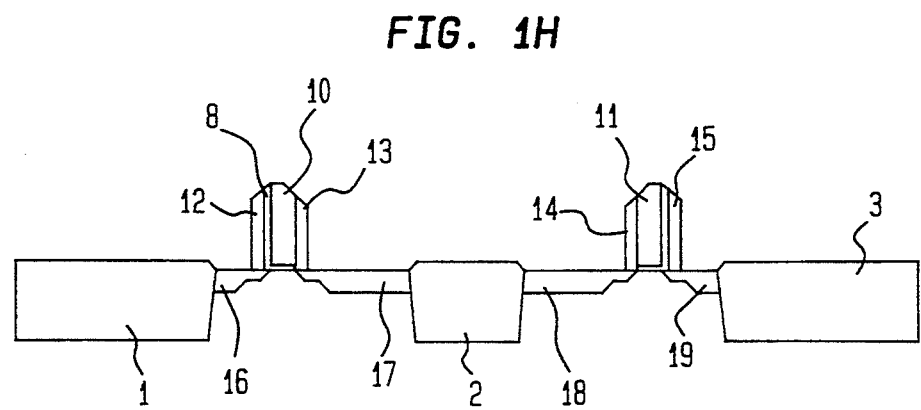
Figure 1I:
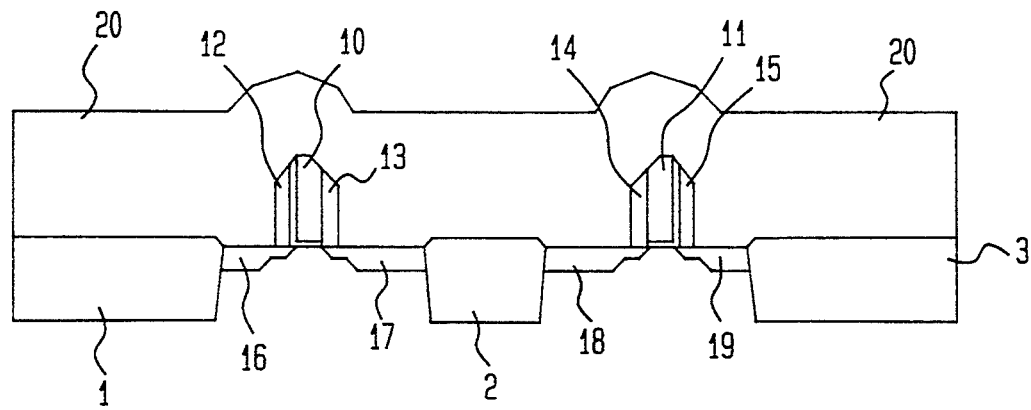

The DLC film 9 of FIG. 1e is anisotropically reactive ion etched in an $O_2/Ar$ plasma to yield DLC sidewalls 10 and 11 of FIG. 1f. The relatively mild RIE conditions do not attack the underlying gate oxide which remains covered by the seed layer 8 and the resulting sidewall itself. Then, the exposed metal seeding layer 8 is stripped with wet etch and the amorphous or polysilicon 6 is removed in a wet silicon etching solution as represented in FIG. 1g. If a lightly doped drain FET device structure is needed, oxide sidewall spacers 12 and 13 are formed on opposite sides of sidewall 10 and oxide sidewall spacers 14 and 15 are formed on opposite sides of sidewall 11 as shown in FIG. 1h. Anisotropic etching techniques are well known in the art for producing sidewall spacer structures. The additional sidewalls are useful in producing the optional lightly-doped drain profiles in the next fabrication steps in accordance with the present invention. It should be noted, in FIG. 1g, that the seeding layers 8 are represented at one side as well as at the bottom of DLC gates 10 and 11.

The source/drain profiles 16–19 of FIG. 1h are produced by lightly ion implanting the structure of FIG. 1g, forming sidewall spacers 12–15 and then heavily implanting the sidewall spacer on-sidewall device and annealing to yield the profiles indicated. In the absence of sidewall spacers 12–15, the implantation profile would not manifest the reduced depth adjacent the gate sidewall structures 10 and 11. As discussed earlier, there is no deterioration of the thin gate dielectrics 7 due to the presence of DLC 10 and 11 during the high temperature annealing cycle.

Figure 1J:
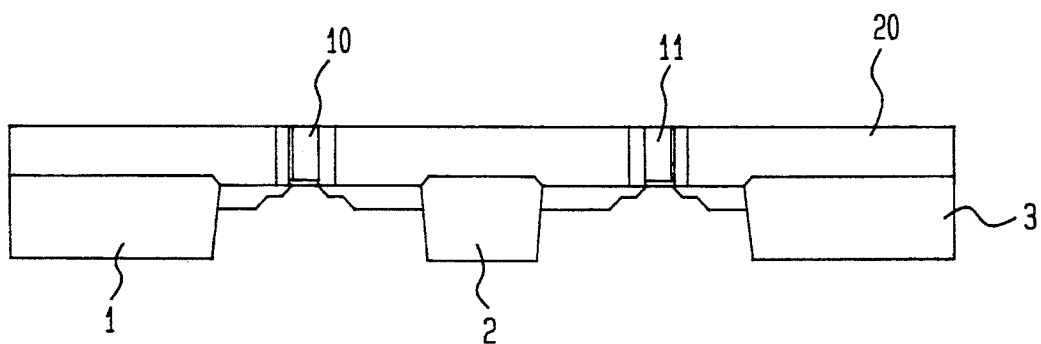
Figure 1K:
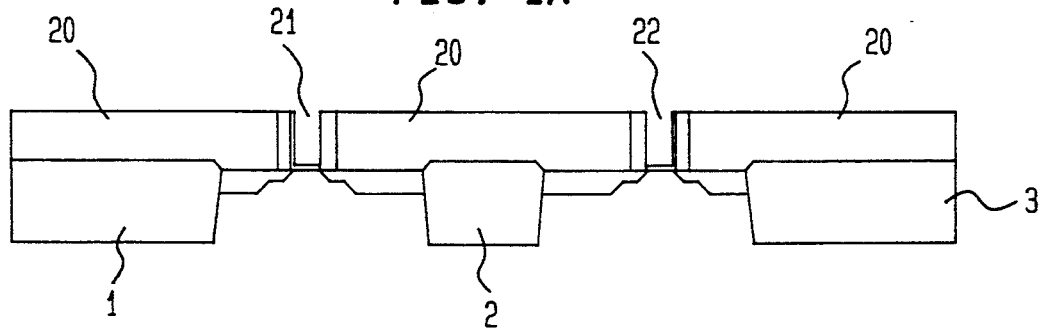
Figure 1L:
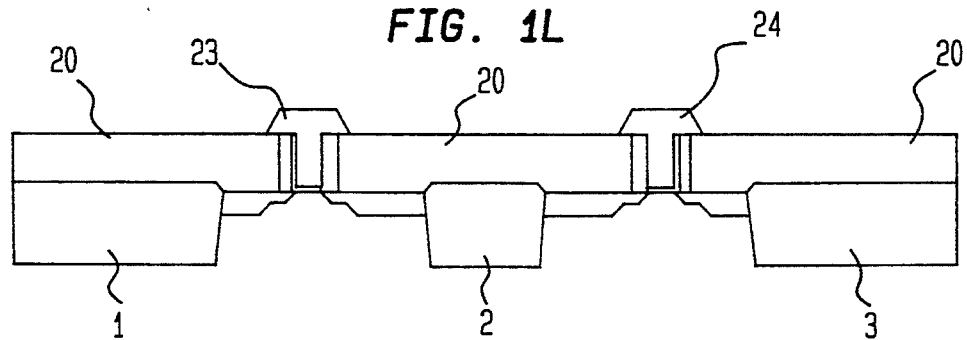

The remainder of the steps depicted in FIGS. 1i–1L provide for planarization and establishment of metal gates to complete the FET structures. Preferably, a silicide (not shown) is formed at the surfaces of the source/drain regions 16–19 of FIG. 1h and a dielectric material 20 of FIG. 1i, such as CVD oxide, is deposited over the structure. The material 20 is planarized by etch back or by chem-mech polishing to uncover the top portion of the DLC structures 10 and 11 (FIG. 1j). Having performed its function of protecting gate oxide 7 from all sources of contamination during the annealing cycle, DLC 10 and 11 now are selectively etched to yield notches 21 and 22 in an $O_2/Ar$ plasma.

CVD gate metal 23 and 24 (such as tungsten or molybdenum) is selectively grown inside notches 21 and 22, respectively, from the seeding layer 8 on the bottom and one sidewall of each notch. Gate metal may be formed by blanket deposition followed by etch back or chem-mech polish. Source and drain contacts may be added in a conventional manner (not shown) to complete the structure of FIG. 1L. It should be noted that the seeding layer 8 as well as the sidewall formation technique for forming gate structures 10 and 11 are warranted primarily by the continuous trend toward the design of ever-reduced submicron dimensions for semiconductor devices. For larger scale devices, both of the aforementioned features may be dispensed with. Such a modified fabrication process will be described with the aid of FIGS. 2a–2h.

Figure 2A:
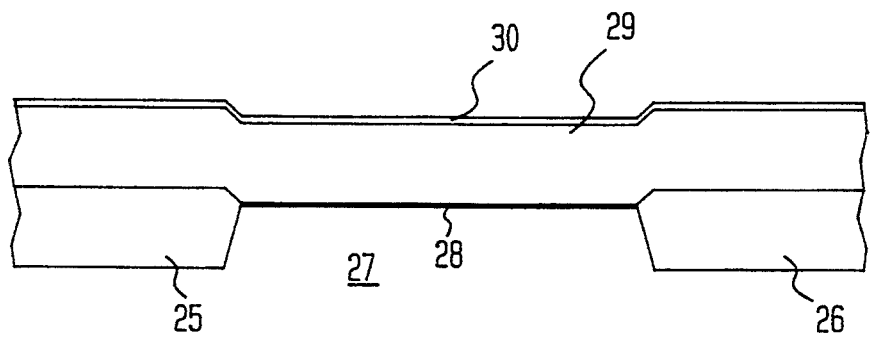
FIGS. 2a–2h are a series of simplified cross-sectional views of a portion of a semiconductor chip as it appears at a succession of times during the fabrication of a second embodiment of the present invention omitting special adaptation for very small sized FETs.
Figure 2B:
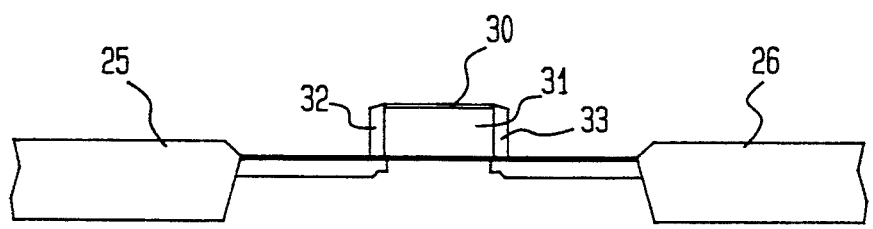
Figure 2C:
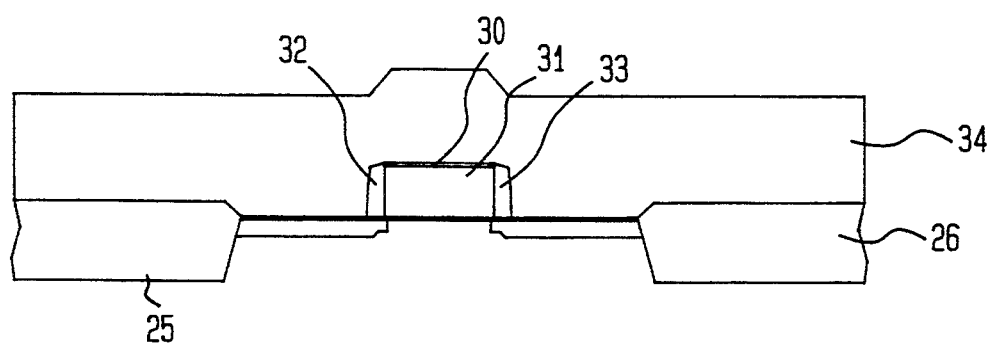

After recessed oxide isolation or shallow trench 25, 26 is formed on silicon substrate 27, a thin layer 28 of gate oxide is grown in the device regions. A layer of DLC 29 about 500 nm thick and a CVD nitride layer 30 about 100 nm thick are deposited as depicted in FIG. 2a. Gate member 31 of FIG. 2b is patterned by a conventional method and the device is shallow and lightly ion implanted, followed by gate sidewall formation (CVD oxide/nitride is deposited and etched back, for example) to provide sidewalls 32 and 33. A second and deeper and heavier ion implantation, similar to the earlier implantation process description relating to FIGS. 1g and 1h, completes the source/drain profiles shown in FIG. 2b after annealing.

Figure 2D:
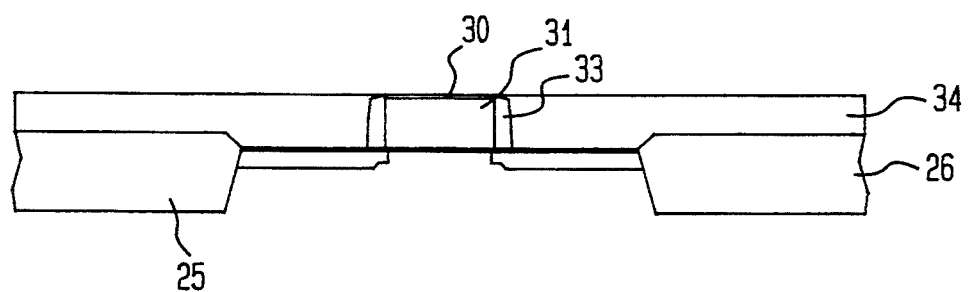
Figure 2E:
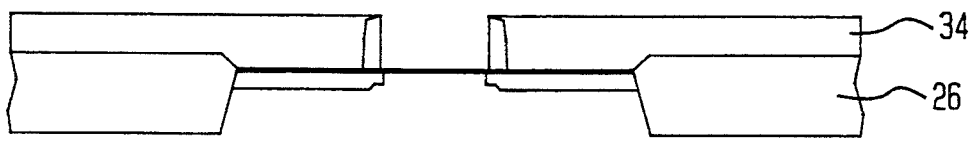
Figure 2F:
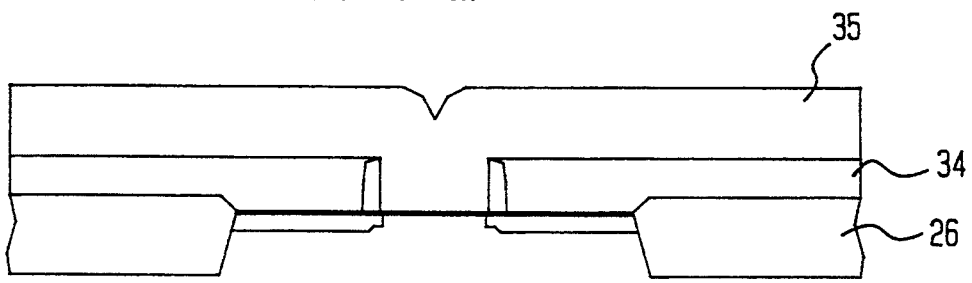
Figure 2G:
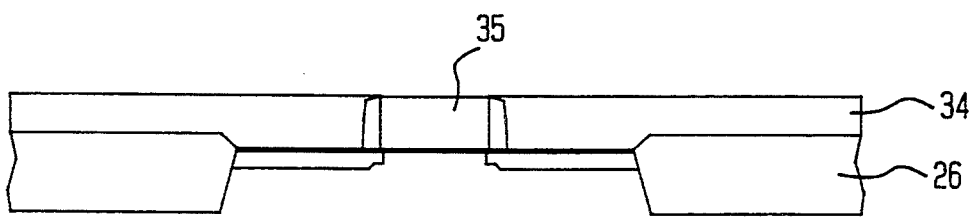
Figure 2H:
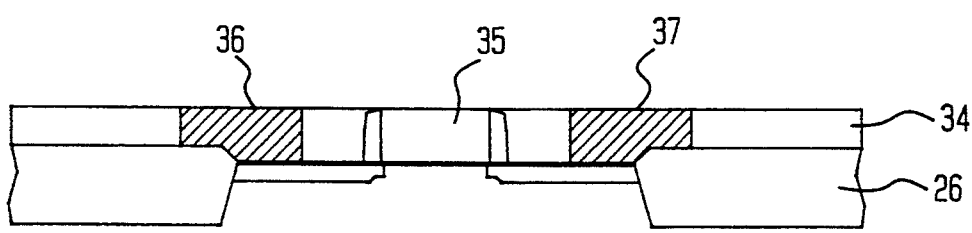

The structure of FIG. 2b is covered by a CVD oxide layer 34 (FIG. 2c) and then is planarized by a chem-mech polish until the layer 30 is uncovered on top of DLC gate 31 (FIG. 2d). The layer 30 and DLC gate 31 are removed (FIG. 2e) by suitable etches such as $CF_4$ and $O_2/Ar$ plasmas, respectively. Metal 35 such as aluminum, molybdenum, gold or tungsten, for example, is deposited (FIG. 2f) and then is polished back to the oxide surface as show in FIG. 2g. Source and drain contacts 36 and 37 (FIG. 2h) are provided by conventional methods to complete the FET structure.

While there have been described what are at present considered to be the preferred embodiments of the present invention, it will be obvious to those skilled in the art that various changes or modifications may be made therein, without departing from the invention, and it is, therefore, aimed in the appended claims to cover all those changes and modifications as follow in the true spirit and scope of the invention.

What is claimed is:

1. A process for making partial FET devices comprising:
   providing a semiconductor substrate,
   forming a gate dielectric member on said substrate,
   forming a masking material of diamond-like-carbon on said dielectric member coextensive with said dielectric member, forming source and drain regions in said substrate adjacent said dielectric member by using said masking material as the mask therefor,
   annealing said regions at a predetermined temperature of at least 400° C.,
   said masking material being characterized by being capable of withstanding said predetermined temperature without contaminating and stressing said dielectric member,
   removing said masking material by employing an $O_2$/Ar plasma etch.

2. The process defined in claim 1 and further comprising:
   forming a layer of metal on said dielectric member in the space vacated by said masking material.

3. The process defined in claim 1 wherein said predetermined temperature is 500° C.

* * * * *